(12) United States Patent
Lee et al.

(10) Patent No.: US 11,804,266 B2
(45) Date of Patent: *Oct. 31, 2023

(54) APPARATUS AND METHOD WITH IN-MEMORY PROCESSING

(71) Applicant: Samsung Electronics Co., Ltd., Suwon-si (KR)

(72) Inventors: Hyungwoo Lee, Seoul (KR); Sangjoon Kim, Hwaseong-si (KR); Yongmin Ju, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/992,143

(22) Filed: Nov. 22, 2022

(65) Prior Publication Data

US 2023/0078279 A1    Mar. 16, 2023

Related U.S. Application Data

(63) Continuation of application No. 17/141,474, filed on Jan. 5, 2021, now Pat. No. 11,587,616.

(30) Foreign Application Priority Data

May 22, 2020 (KR) .................. 10-2020-0061746

(51) Int. Cl.
  *G11C 11/54* (2006.01)
  *G11C 13/00* (2006.01)
  *G06N 3/063* (2023.01)
(52) U.S. Cl.
  CPC ......... *G11C 13/0069* (2013.01); *G06N 3/063* (2013.01); *G11C 11/54* (2013.01);
  (Continued)

(58) Field of Classification Search
  CPC ........................................... G11C 11/54
  See application file for complete search history.

(56) References Cited

U.S. PATENT DOCUMENTS

| 6,188,615 B1 | 2/2001 | Perner et al. |
| 11,587,616 B2 * | 2/2023 | Lee .................. G11C 13/0028 |

(Continued)

FOREIGN PATENT DOCUMENTS

| JP | 2017-228295 A | 12/2017 |
| KR | 10-2018-0093245 A | 8/2018 |

OTHER PUBLICATIONS

Jiang, Yuning, et al. "Design and hardware implementation of neuromorphic systems with RRAM synapses and threshold-controlled neurons for pattern recognition." IEEE Transactions on Circuits and Systems I: Regular Papers vol. 65 No. 9 Sep. 2018: pp. 2726-2738.

(Continued)

*Primary Examiner* — Douglas King
(74) *Attorney, Agent, or Firm* — NSIP Law

(57) ABSTRACT

An apparatus for performing in-memory processing includes a memory cell array of memory cells configured to output a current sum of a column current flowing in respective column lines of the memory cell array based on an input signal applied to row lines of the memory cells, a sampling circuit, comprising a capacitor connected to each of the column lines, configured to be charged by a sampling voltage of a corresponding current sum of the column lines, and a processing circuit configured to compare a reference voltage and a currently charged voltage in the capacitor in response to a trigger pulse generated at a timing corresponding to a quantization level, among quantization levels, time-sectioned based on a charge time of the capacitor, and determine the quantization level corresponding to the sam- (Continued)

pling voltage by performing time-digital conversion when the currently charged voltage reaches the reference voltage.

12 Claims, 14 Drawing Sheets

(52) U.S. Cl.
CPC ........ *G11C 13/004* (2013.01); *G11C 13/0026* (2013.01); *G11C 13/0028* (2013.01); *G11C 13/0038* (2013.01); *G11C 13/0061* (2013.01)

(56) References Cited

U.S. PATENT DOCUMENTS

| | | |
|---|---|---|
| 2005/0024950 A1 | 2/2005 | Sakimura et al. |
| 2008/0309540 A1 | 12/2008 | Baker |
| 2012/0307867 A1 | 12/2012 | Chung et al. |
| 2017/0146959 A1 | 5/2017 | Cho et al. |
| 2017/0364791 A1 | 12/2017 | Miyashita et al. |
| 2017/0364793 A1 | 12/2017 | Kim et al. |
| 2019/0042160 A1 | 2/2019 | Kumar et al. |
| 2019/0295669 A1 | 9/2019 | Yang et al. |
| 2021/0142156 A1 | 5/2021 | Tran et al. |

OTHER PUBLICATIONS

Extended European Search Report dated Oct. 22, 2021, in counterpart European Patent Application No. 21172460.4 (12 pages in English).

\* cited by examiner

APPARATUS AND METHOD WITH IN-MEMORY PROCESSING

CROSS-REFERENCE TO RELATED APPLICATION

This application is a continuation of application Ser. No. 17/141,474 filed on Jan. 5, 2021, which claims the benefit under 35 USC 119(a) of Korean Patent Application No. 10-2020-0061746, filed on May 22, 2020, in the Korean Intellectual Property Office, the entire disclosure of which is incorporated herein by reference for all purposes.

BACKGROUND

1. Field

The disclosure relates to an apparatus and method with in-memory processing.

2. Description of Related Art

A neural network is a computing system implemented on the basis of a computational architecture. Neural network processing requires a large amount of computation for complex input data. As neural network data increases and connectivity of the architecture forming a neural network gets complicated, the computational amount and memory access frequency of the processing device may excessively increase, resulting in inefficient performance and miniaturization issues. For example, neural network processing may include a multiply-accumulate (MAC) operation that repeats multiplications and additions, which may need efficient hardware architecture and hardware driving methods to process, at low power and high speed, a large amount of computation.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an apparatus for performing in-memory processing includes a memory cell array of memory cells configured to output a current sum of a column current flowing in respective column lines of the memory cell array based on an input signal applied to row lines of the memory cells, a sampling circuit, comprising a capacitor connected to each of the column lines, configured to be charged by a sampling voltage of a corresponding current sum of the column lines, and a processing circuit configured to compare a reference voltage and a currently charged voltage in the capacitor in response to a trigger pulse generated at a timing corresponding to a quantization level, among quantization levels, time-sectioned based on a charge time of the capacitor, and determine the quantization level corresponding to the sampling voltage by performing time-digital conversion when the currently charged voltage reaches the reference voltage.

The processing circuit may include a control signal generator configured to generate the trigger pulse at the timing corresponding to the quantization level and a counting pulse in synchronism with the generation of the trigger pulse, and a comparator connected to each column line and activated by the application of the trigger pulse.

Each of the quantization levels may correspond to a sub-time section of a total time section in which a charge voltage changes until the capacitor is charged with the sampling voltage.

The sub-time section may be determined based on either one or both a resistance value of the memory cells and a capacitance of the capacitor.

The quantization level corresponding to the timing of the trigger pulse generation may be one level greater than a minimum quantization level of the quantization levels.

The processing circuit may include a comparator, and a time-digital converter (TDC). The comparator, connected to each of the column lines, may be configured to receive the trigger pulse as a start signal of the comparison operation, and output a stop signal when the currently charged voltage reaches the reference voltage. The TDC may be configured to output a counting value of a counting pulse as a digital value when the stop signal is received, the counting pulse being applied in synchronism with the trigger pulse at a time point when the stop signal is received.

The TDC may include flip-flops, connected to the comparators, configured to latch a current counting value at a time point when the stop signal is received.

One of the comparators which outputs the stop signal may be deactivated.

The comparators may be of a latched comparator type.

The trigger pulse may be applied until a time section corresponding to a quantization level that is one level less than a maximum quantization level of the quantization levels.

A minimum quantization level of the quantization levels may correspond to the memory cells included in each one of the column lines having a maximum composite resistance, and a maximum quantization level of the quantization levels may correspond to the of memory cells included in each one of the column lines having a minimum composite resistance.

In another general aspect, a computing apparatus includes an in-memory processing device, including a memory cell array, a sampling circuit, and a processing circuit. The memory cell array of memory cells is configured to output a current sum of a column current flowing in respective column lines of the memory cell array based on an input signal applied to row lines of the memory cells. The sampling circuit, including a capacitor connected to each of the column lines, is configured to be charged by a sampling voltage of a corresponding current sum of the column lines. The processing circuit is configured to compare a reference voltage and a currently charged voltage in the capacitor in response to a trigger pulse generated at a timing corresponding to a quantization level, among quantization levels, time-sectioned based on a charge time of the capacitor, and determine the quantization level corresponding to the sampling voltage by performing time-digital conversion when the currently charged voltage reaches the reference voltage.

The processing circuit may include a control signal generator configured to generate the trigger pulse at the timing corresponding to the quantization level and a counting pulse in synchronism with the generation of the trigger pulse, and a comparator connected to each column line and activated by the application of the trigger pulse.

Each of the quantization levels may correspond to a sub-time section of a total time section in which a charge voltage changes until the capacitor is charged with the sampling voltage.

The quantization level corresponding to the timing of the trigger pulse generation may be one level greater than a minimum quantization level of the quantization levels.

The computing apparatus may further include a host processor and memory storing instructions that, when executed by the host processor, configure the host processor control the in-memory processing device to: output the current sum of the column current flowing in respective column lines of the memory cell array based on the input signal applied to the row lines of the memory cells, the capacitor to be charged by the sampling voltage of the corresponding current sum of the column lines; and compare the reference voltage and the currently charged voltage in the capacitor in response to the trigger pulse generated at the timing corresponding to the quantization level.

The processing circuit may include a comparator, connected to each of the column lines, configured to receive the trigger pulse as a start signal of the comparison operation, and output a stop signal when the currently charged voltage reaches the reference voltage; and a time-digital converter (TDC) configured to output a counting value of a counting pulse as a digital value when the stop signal is received, the counting pulse being applied in synchronism with the trigger pulse at a time point when the stop signal is received.

The TDC may include flip-flops connected to the comparators, configured to latch when the stop signal is received, a current counting value at a time point when the stop signal is received.

One of the comparators which outputs the stop signal may be deactivated.

In another general aspect, a method of performing in-memory processing, includes: applying an input signal to row lines of memory cells of a memory cell array; charging a capacitor connected to each column line of the memory cells using a sampling voltage corresponding to a current sum of a column current flowing in respective column lines; comparing a reference voltage and a currently charged voltage in the capacitor in response to a trigger pulse generated at a timing corresponding to a quantization level, among quantization levels, time-sectioned based on a charge time of the capacitor; and determining the quantization level corresponding to the sampling voltage by performing time-digital conversion when the currently charged voltage reaches the reference voltage.

The method may further include: generating the trigger pulse at the timing corresponding to the quantization level; and generating a counting pulse in synchronism with the generation of the trigger pulse. The determining of the quantization level may include when a time-digital converter (TDC) receives, from a comparator, a stop signal indicating that the currently charged voltage in the capacitor reached the reference voltage, determining the quantization level by outputting a counting value of the counting pulse as a digital value at a time point when the stop signal is received.

In another general aspect, an apparatus for performing in-memory processing includes memory cells, a sampling circuit, a processing circuit, and a time-digital converter (TDC). The memory cells have adjacent ones connected to each other to form a memory cell array configured to output a sum of current flowing in respective column lines of the memory cell array based on an input signal applied to row lines of the memory cells. The sampling circuit, includes a capacitor connected to each of the column lines, configured to be charged by a sampling voltage of the sum of current flowing in respective column lines. The processing circuit is configured to compare a reference voltage and a currently charged voltage in the capacitor in response to a trigger pulse based on a quantization level, among quantization levels, dependent on a charge time of the capacitor, and determine the quantization level corresponding to the sampling voltage when the currently charged voltage reaches the reference voltage. The time-digital converter (TDC) is configured to output a counting value of a counting pulse synchronously applied with the trigger pulse.

The TDC may include flip-flops, connected to the comparators, configured to latch a current counting value at a time point when the stop signal is received.

One of the comparators which outputs the stop signal may deactivated.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
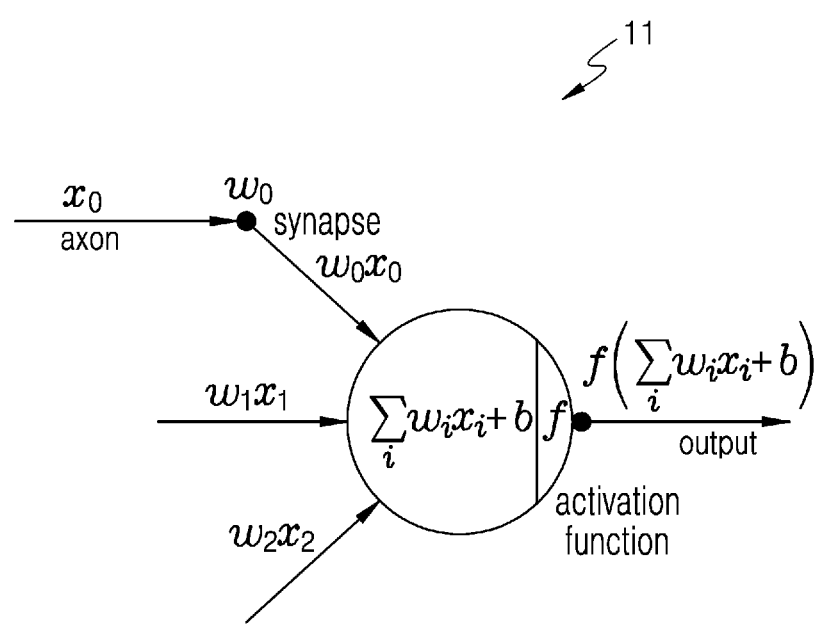
FIG. 1 illustrates an example of a mathematical model related to an operation of a biological neuron.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after understanding of the disclosure of this application may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 illustrates an example of a neural network mathematical model 11 stimulating an operation of a biological neuron.

The mathematical model 11 is an example of a neuromorphic operation that may be simulated by a hardware computational element or processor, which includes, regarding information from a number of neurons, a multiplication operation of multiplying a synaptic weight, an addition operation ($\Sigma$) with respect to values ($\omega_0 x_0$, $\omega_1 x_1$, $\omega_2 x_2$) being multiplied by the respective synaptic weights, and an operation of applying a characteristic function (b) and an activation function (f) to the addition operation result. A simulated neuromorphic operation result may be provided by the neuromorphic operation. Values such as $x_0$, $x_1$, $x_2$, . . . , etc. may be referred to as axon values, and values such as $\omega_0$, $\omega_1$, $\omega_2$, . . . , etc. may be referred to as synaptic weights. Herein, it is noted that use of the term "may" with respect to an example or embodiment, e.g., as to what an example or embodiment may include or implement, means that at least one example or embodiment exists in which such a feature is included or implemented while all examples and embodiments are not limited to these examples.

Figure 2:
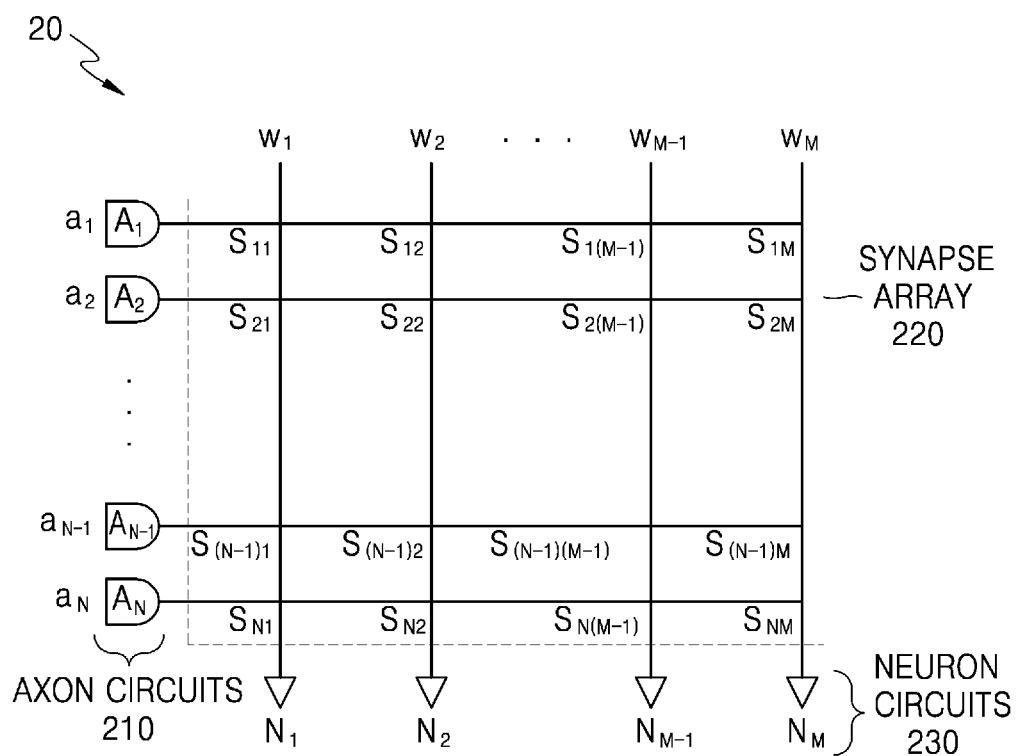
FIG. 2 illustrates a configuration of a two-dimensional array circuit for performing a neuromorphic operation according to one or more embodiments.

FIG. 2 illustrates a configuration of a two-dimensional array circuit 20 for performing a neuromorphic operation according to one or more embodiments.

Referring to FIG. 2, the two-dimensional array circuit 20 may include N axon circuits $A_1$ to $A_N$ 210, where N is a natural number, M neuron circuits $N_1$ to $N_M$ 230, where M is a natural number, and N×M synapse arrays $S_{11}$ to $S_{NM}$ 220. Herein, with respect to examples and descriptions of FIGS. 1-14, as well as remaining examples, the Summary, and the claims, the use of the term "neuron" is not meant to mean that the "neuron" has any other meaning beyond a technological meaning, i.e., it is not meant to mean that that the term "neuron" hereinafter is structurally and operatively the same or analogous in hardware and hardware implementation with respect to chemical and neurological neuron implementations. Similarly, with the terms "neuron circuit", "synapse", "synapse circuit", "axon", or "axon circuit" with respect to examples and descriptions of FIGS. 1-14, as well as remaining examples, the Summary, and the claims, the use of the term "neuron", "synapse", "axon", or "axon circuit" is not meant to mean that the "neuron", "synapse", "axon", or "axon circuit" have any other meaning beyond a technological meaning, i.e., it is not meant to mean that that the term "neuron", "synapse", "axon", or "axon circuit" hereinafter is structurally and operatively the same or analogous in hardware and hardware implementation with respect to chemical and neurological neuron implementations. For example, an artificial neural network may be hardware that is configured to have multiple layers of hardware nodes, i.e., referred as such "neurons" below.

Synapses of the synapse arrays $S_{11}$ to $S_{NM}$ 220 may be respectively located at intersections of first direction lines extending from the axon circuits $A_1$ to $A_N$ 210 in a first direction and second direction lines extending from the neuron circuits $N_1$ to $N_M$ 230 in a second direction. For convenience of explanation, the first direction is illustrated to be a row direction and the second direction is illustrated to be a column direction. However, the disclosure is not limited to these examples, and the first direction may be a column direction and the second direction may be a row direction.

Each of the axon circuits $A_1$ to $A_N$ 210, which simulates the axon of a neuron, may receive an input of an activation, for example, axons $a_1, a_2, \ldots, a_N$, and transmit the received activation to the first direction lines. The activation, which corresponds to the neurotransmitter that is transmitted through the neuron, may mean an electrical signal input to each of the axon circuits $A_1$ to $A_N$ 210. Each of the axon circuits $A_1$ to $A_N$ 210 may include a memory, register, or buffer for storing input information. The activation may be binary activation having a binary value. For example, the binary activation may include 1-bit information corresponding to a logic value 0 or 1, or a logic value −1 or 1. However, the disclosure is not limited to this example, and the activation may have a ternary value or a multi-bit value.

The synapse arrays $S_{11}$ to $S_{NM}$ 220 may store synaptic weights that correspond to the strength of the interconnection between the neurons. Although FIG. 2 illustrates $w_1, w_2, \ldots, w_M$ as examples of the synaptic weights to be stored in the respective synapses, for convenience of explanation, other synaptic weights may be stored in the respective synapses. Each synapse of the synapse arrays $S_{11}$ to $S_{NM}$ 220 may include a memory device for storing the synaptic weights or may be connected to other memory device that stores the synaptic weights. Such a memory device may correspond to, for example, a memristor or a resistive memory cell. The memristor or resistive memory cell may be implemented by static random access memory (SRAM), phase change memory (PCM), oxide based memory (OXRAM), magnetoresistive random access memory (MRAM), spin-transfer torque random access memory (STT-RAM), conductive bridge random access memory (CBRAM), resistive RAM (RRAM), ferroelectric RAM (FRAM), magnetic tunnel junction (MTJ) device, etc., but the disclosure is not limited to these examples.

Each of the synapse arrays $S_{11}$ to $S_{NM}$ 220 may receive an activation input that is transmitted by each of the axon circuits $A_1$ to $A_N$ 210 through the corresponding first direction line, and may output a result of a neuromorphic operation between the stored synaptic weight and the activation input. For example, the neuromorphic operation between the synaptic weight and the activation input may be a multiplication operation, that is, an AND operation, but the disclosure is not limited to this example. In other words, a result of the neuromorphic operation between the synaptic weight and the activation input may be a value obtained by other appropriate operation that reflects the strength or size of activations adjusted based on the interconnection strengths between neurons.

The amplitude or strength of a signal transmitted from the axon circuits $A_1$ to $A_N$ 210 to the neuron circuits $N_1$ to $N_M$ 230 according to the neuromorphic operation between the synaptic weight and the activation input may be adjusted. As such, an operation of adjusting the amplitude or strength of a signal transmitted to the next neuron, according to the interconnection strength between neurons, by using the synapse arrays $S_{11}$ to $S_{NM}$ 220 may be implemented.

Each of the neuron circuits $N_1$ to $N_M$ 230 may receive a result of the neuromorphic operation between the synaptic weight and the activation input through the corresponding second direction line. Each of the neuron circuits $N_1$ to $N_M$ 230 may determine whether to output a spike on the basis of a result of the neuromorphic operation. For example, each of the neuron circuits $N_1$ to $N_M$ 230 may output a spike when a value obtained by accumulating the result of the neuromorphic operation is greater than or equal to a preset critical value. The spikes output from the neuron circuits $N_1$ to $N_M$ 230 may correspond to activation input to the axon circuits of a next stage.

The neuron circuits $N_1$ to $N_M$ 230 are located at the post stage with respect to the synapse arrays $S_{11}$ to $S_{NM}$ 220, which may be referred to as the post-synaptic neuron circuits, and the axon circuits $A_1$ to $A_N$ 210 are located at the pre-stage with respect to the synapse arrays $S_{11}$ to $S_{NM}$ 220, which may be referred to as the pre-synaptic neuron circuits.

Figure 3:
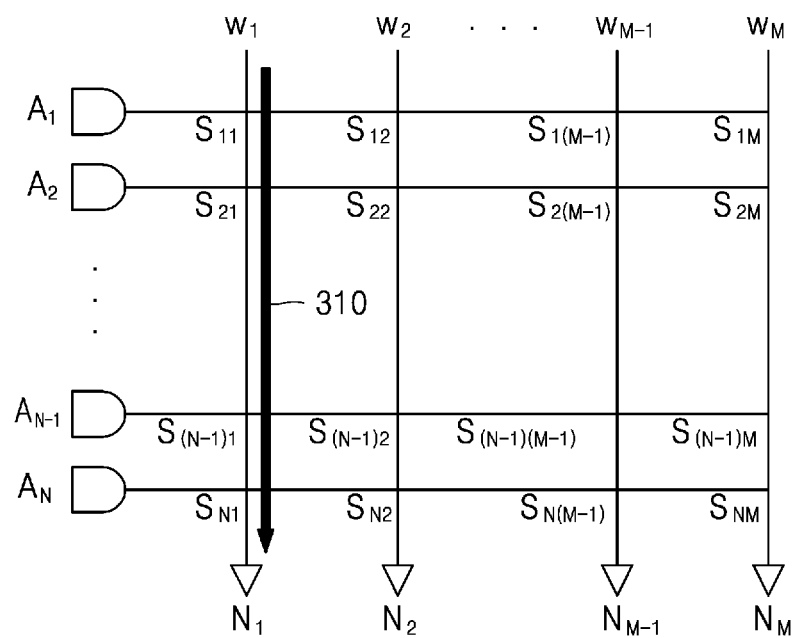
FIG. 3 illustrates a neuromorphic operation processing method according to one or more embodiments.

FIG. 3 illustrates a neuromorphic operation processing method according to one or more embodiments.

The two-dimensional array circuit for processing a neuromorphic operation may use a current summation method for each column line. For example, the two-dimensional array circuit may sum a current flowing along a column line 310 through the synapses $S_{11}, S_{21}, S_{(N-1)1}$, and $S_{N1}$ by the activation transmitted from the axon circuits $A_1$ to $A_N$ 210, and output a spike when the amount or intensity of the summed current is greater than or equal to a preset critical value. In this state, to obtain the amount or intensity of the summed current, a periphery circuit such as an analog-to-digital converter (ADC), a digital-to-analog converter (DAC), or the like may be provided. However, the ADC or DAC may serve as an inefficient overhead factor in terms of power and size with respect to the overall circuit configuration. Accordingly, in the following description, according to the present examples, instead of the ADC or DAC that performs the neuromorphic operation like a multiply-accumulate (MAC) operation repeating additions and multiplications, a method of implementing an on-chip system with a high degree of integration with a circuit design based on a time-digital converter (TDC) is further described.

Figure 4:
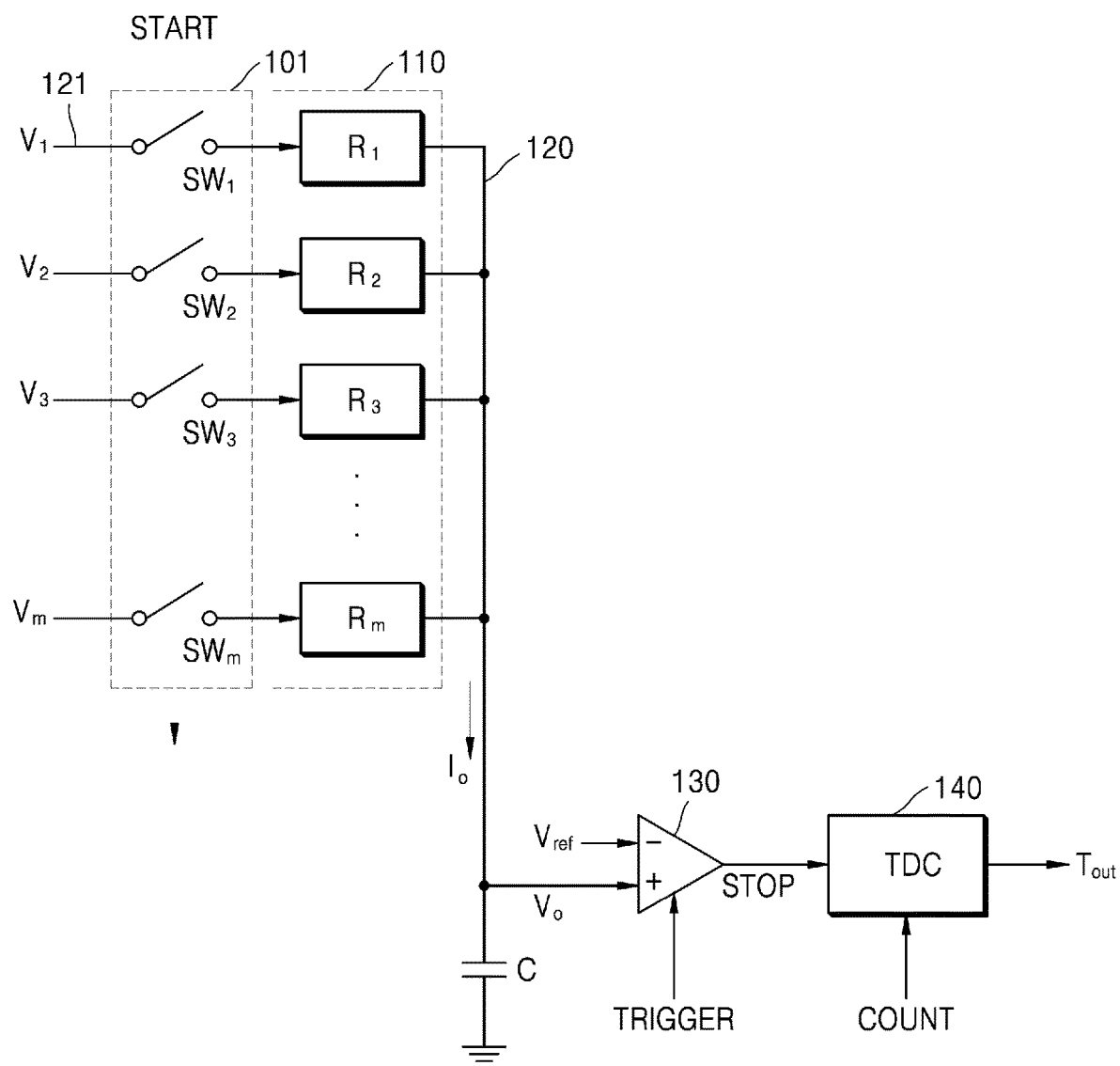
FIG. 4 illustrates an in-memory processing device according to one or more embodiments.

FIG. 4 illustrates an in-memory processing device 100 according to one or more embodiments.

In FIG. 4, the in-memory processing device 100 may include a circuit that outputs a result of multiplications and additions performed for a neuromorphic operation.

The in-memory processing device 100 may include a plurality of memory cells 110, a capacitor C, and a TDC 140, for example. Furthermore, the in-memory processing device 100 may further include a comparator 130 for generating time information to be transmitted to the TDC 140. In FIG. 4, for the convenience of explanation, only a column line 120 and row lines 121 corresponding to a part of a memory cell array provided in the in-memory processing device 100 are illustrated. The row lines 121 extend in a first direction (for example, a horizontal direction) and a column line 120 extend in a second direction (for example, a vertical direction) intersecting the first direction. The plural row lines 121 may be collectively referred to as the row line 121 and plural column lines 120 may be collectively referred to as the column line 120.

Accordingly, the in-memory processing device 100 may include a memory cell array in which a plurality of memory cells are arranged at positions where a plurality of column lines and row lines intersect with each other.

The memory cells 110, as described above, are implemented by a memristor or a resistive memory device, and may be a device having variable resistance. A voltage $V_1, V_2, V_3, \ldots, V_m$ may be applied to the memory cells 110 in response to an input signal via the row line. For example, an input voltage or a supply voltage may be applied by the input signal to the memory cells 110.

One end of each of the memory cells 110 may be configured to receive a voltage through a switch SW, and the other end of each of the memory cells 110 may be connected to the capacitor C and the comparator 130. In other words, the capacitor C and the comparator 130 are connected to each column line including the memory cells 110.

According to the resistance value of each of the memory cells 110 and the voltage value of the input signal applied to each of the memory cells 110, a current having a current value calculated based on the Ohm's law flows in the column line 120. Accordingly, a current sum $I_o$ of a column current flowing through the column line 120 may correspond to a result value of the MAC operation between the corresponding memory cells and input signals.

Each of the input signals, that is, the input voltages $V_1$, $V_2$, $V_3$, ..., $V_m$, may be applied to each of the memory cells 110 in response to a start signal START. To this end, the in-memory processing device 100 may include a plurality of switches 101 that are switched by the start signal START. One end of each of the switches 101 may be connected to one end of each of the memory cells 110. For example, a first switch $SW_1$ may be connected to one end of a first memory cell $R_1$, ..., and the m-th switch $SW_m$ may be connected to one end of the m-th memory cell $R_m$, where m is a natural number greater than or equal to 1. The other end of each of the switches 101 may be connected to each of the input signals, that is, the input voltages $V_1$, $V_2$, $V_3$, ..., $V_m$. The input signal is not always applied to all of the memory cells 110, and may not be applied to some memory cells based on the value of the input signal (input voltage value). In this state, when the input signal that is not applied may mean an example in which the input voltage is 0, but the disclosure is not limited to this example, and the input signal may have a specific voltage value.

The input signals may correspond to individual bit values of an input bit sequence including a series of binary values. In further detail, in the in-memory processing device 100, each of a plurality of row lines may correspond to each bit position of the input bit sequence. For example, when a bit value at a bit position is 1, an input signal having a voltage value corresponding to the bit value 1 may be applied to the row line corresponding to the bit position. Unlike the above, when a bit value at a bit position is 0, an input signal having a voltage value, for example, 0 V, corresponding to the bit value 0 may be applied to the row line corresponding to the bit position.

The resistance value of each of the memory cells 110 may have a bit value, for example, a weight or a synaptic weight, multiplied to each bit of the input bit sequence. As the memory cells 110 may be implemented by a resistive memory device having variable resistance, of the memory cells 110, a memory cell corresponding to the bit value 1 may have a first resistance value and a memory cell corresponding to the bit value 0 may have a second resistance value. Alternatively, the disclosure is not limited to this example, and the memory cells 110 may be implemented by a circuit that is switched to select, by using a switching device, a resistor corresponding to the bit value from among a plurality of resistors having different resistance values.

In the present embodiment, although it is assumed that the bit value is 1 or 0, the disclosure is not limited to this example, and the bit value may be 1 or −1, other binary bit values such as ternary bit values, or the like.

The capacitor C may be connected to the column line 120 to which the memory cells 110 is connected, and may be charged by a voltage corresponding to the current sum $I_o$ of the column current flowing in the column line 120.

In the in-memory processing device 100, the capacitor C is connected to each column line 120 and samples a voltage corresponding to the current sum $I_o$ of the column line 120. Accordingly, in the in-memory processing device 100, the capacitors C connected to each column line 120 may constitute a sampling circuit to be charged with a sampling voltage $V_o$ corresponding to the current sum $I_o$ of the corresponding column line.

The comparator 130 may be connected to one end of the capacitor C. In one example, the comparator 130 may perform a comparison operation of comparing a currently charged voltage with a reference voltage $V_{ref}$ (reference voltage) while the capacitor C is charged with the sampling voltage $V_o$. The comparator 130 may be implemented by, for example, an operational amplifier (OP amp). The sampling voltage $V_o$ of the capacitor C may be input to one input node of the OP amp, and the reference voltage $V_{ref}$ may be input to the other input node thereof.

The sampling voltage $V_o$, which is a voltage corresponding to the current sum $I_o$ of the column line 120 connected to the capacitor C, may be a value corresponding to the result of a MAC operation between the resistance values of the memory cells 110 and the applied input signals.

In the capacitor C, a charge voltage may vary over time on the basis of a time constant ($\tau = R*C$) determined by a composite resistance value of the column line 120 and capacitance. The composite resistance value of the column line 120 is a value depending on the sampling voltage $V_o$ of the column line 120 or the current sum $I_o$ of the column line 120. For example, when the current sum $I_o$ of the column line 120 is relatively great (or, the sampling voltage $V_o$ is relatively less), the time constant T of the capacitor C decreases, and thus the capacitor C may be charged relatively fast. In contrast, when the current sum $I_o$ of the column line 120 is relatively less or the sampling voltage $V_o$ is relatively greater, the time constant $\tau$ of the capacitor C increases, and thus the capacitor C may be charged relatively slowly.

The reference voltage $V_{ref}$, which is a voltage to identify a voltage change time, for example, a charge time, elapsed while the capacitor C is charged with the sampling voltage $V_O$, may mean a voltage that is a reference in the measurement of the voltage change time, for example, the charge time. The reference voltage $V_{ref}$ may be set considering circuit device characteristics such as the capacitor C, the memory cells 110, or the like, and a time for the voltage charged the capacitor C to reach the reference voltage $V_{ref}$. For example, on the basis of the circuit device characteristics such as the capacitor C, the memory cells 110, or the like, when a time of about 40 ns is desired to be consumed for the voltage charged in the capacitor C to reach the reference voltage $V_{ref}$, the reference voltage $V_{ref}$ may be set to be a value between about 0.1 V to about 0.3 V in a non-limiting example. However, these are exemplary figures for convenience of explanation, and the reference voltage $V_{ref}$ may be a value that is set considering the circuit configuration of the in-memory processing device 100.

The comparator 130 may output a stop signal STOP in response to an example where, while the capacitor C is gradually charged by the application of the sampling voltage $V_o$, the voltage currently charged in the capacitor C exceeds the reference voltage $V_{ref}$. In other words, the comparator 130 may output the stop signal STOP in response to an example where the voltage currently charged in the capacitor C reaches the reference voltage $V_{ref}$.

The comparator 130 may perform the comparison operation by being activated (or enabled) only while a trigger pulse TRIGGER signal is applied, which is described below in detail.

The TDC 140, when receiving the stop signal STOP from the comparator 130, is synchronized with the trigger pulse TRIGGER at a time point when the stop signal STOP is received, and outputs a counting value $T_{out}$ of an applied counting pulse COUNT as a digital value. The digital value output from the TDC 140 may indicate a quantization level corresponding to the sampling voltage $V_o$.

The memory cells 110, the capacitor C, the comparator 130, and the TDC 140, which are illustrated in FIG. 4, may correspond to one output line, that is, one column line, on a memory cell array in the in-memory processing device 100. However, as described above, the memory cell array may be provided with a plurality of output lines, that is, a plurality of column lines.

Figure 5:
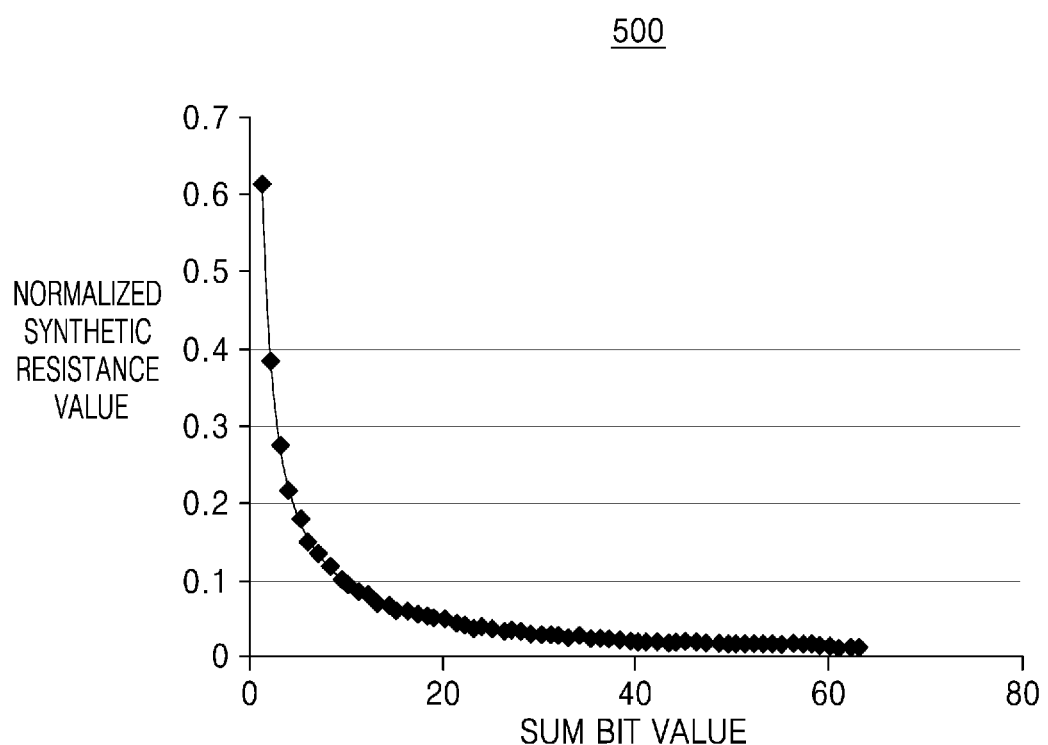
FIG. 5 is a graph showing a mapping relationship between a composite resistance value and a sum bit value of a column line according to one or more embodiments.

FIG. 5 is a graph 500 showing a mapping relationship between a composite resistance value and a sum bit value of a column line, according to one or more embodiments.

In FIG. 5, in the graph 500, an x axis denotes a sum bit value calculated in a column line. In the graph 500, a y axis denotes a normalized composite resistance value in the column line. The composite resistance value in the column line is inversely proportional to the current sum of the column line.

In the graph 500, it may be seen that a composite resistance value in a column line is inversely proportional to the sum bit value corresponding to the MAC operation result in the column line. In other words, it may be seen that a current sum in a column line is inversely proportional to the sum bit value corresponding to the MAC operation result in the column line. Accordingly, considering the above correlation, it may be seen that the MAC operation result may be estimated from the sampling voltage $V_o$ applied to the capacitor C.

Figure 6:
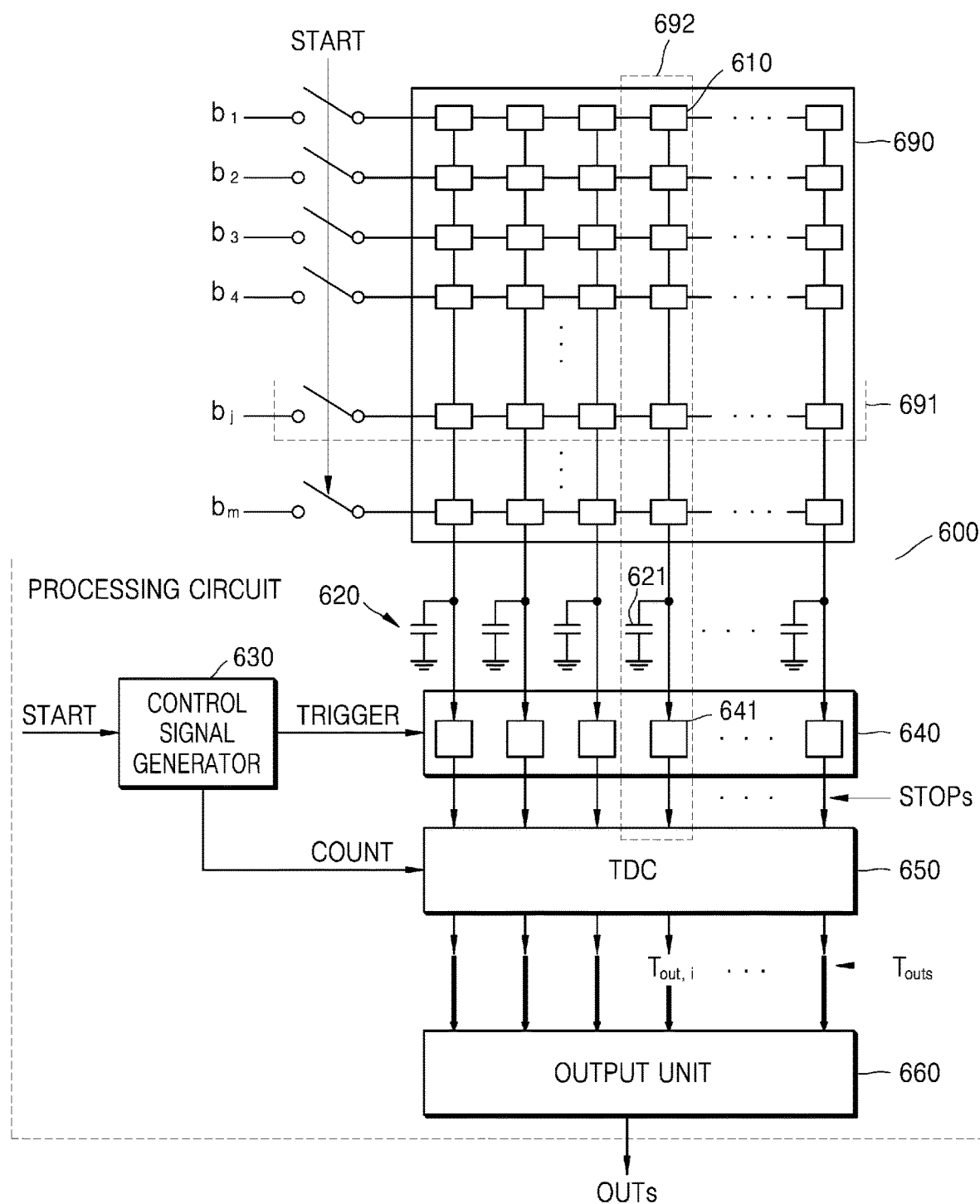
FIG. 6 illustrates an in-memory processing device according to one or more embodiments.

FIG. 6 illustrates an in-memory processing device according to one or more embodiments.

Although a plurality of input lines (row lines) and one output line (the column line 120) in the in-memory processing device 100 are described in FIG. 4 above, FIG. 6 illustrates an in-memory processing device 60 provided with a memory cell array 690 including a plurality of input lines (row lines) and a plurality of output lines (column lines).

The memory cell array 690 in the in-memory processing device 60 may include the input lines (row lines) individually receiving an input signal and the output lines (column lines) individually outputting an output signal. The input lines (row lines) may respectively intersect the output lines (column lines). Although FIG. 6 illustrates that the input line (row line) and the output line (column line) perpendicularly intersect with each other, the disclosure is not limited to this example.

A switch for switching the application of an input signal by input signals $b_1, b_2, b_3, b_4, \ldots, b_j, \ldots, b_m$, and the start signal START is connected to each of the input lines (row lines). The input signals $b_1, b_2, b_3, b_4, \ldots, b_j, \ldots, b_m$ may correspond to input voltages (or input currents) indicating binary values, but the disclosure is not limited to this example. For example, an input signal indicating a bit value 1 may represent a voltage, and an input signal indicating a bit value 0 may represent a floating voltage.

Memory cells 610 are respectively provided at positions where the input lines (row lines) and the output lines (column lines) intersect with each other.

Each of the memory cells 610 may be configured to receive an input signal (input voltage) through an input line (row line) of the input lines (row lines) where the memory cell is disposed. For example, the memory cells 610 arranged along a j-th input line 691 may be configured to receive a j-th input signal in response to the start signal START.

A processing circuit 600 in the in-memory processing device 60 may include capacitors 620 and comparators 640, which are connected to one end of each of the output lines (column lines), a TDC 650, and an output unit 660.

The capacitors 620 are individually disposed at the respective output lines (column lines), and a capacitor connected to any one output line (column line) forms a sampling circuit that is charged with a sampling voltage corresponding to a current sum of the output line (column line).

Each of the capacitors 620 may be charged as the charge amount gradually increases due to the application of a respective sampling voltage. For example, a capacitor 621 disposed on an i-th output line (an i-th column line) 692 may be charged as a voltage, that is, a sampling voltage, corresponding to a current sum is applied on the basis of the input voltages of the input signals and the resistance values of the memory cells of the i-th output line (the i-th column line) 692.

The capacitors 620 connected to the output lines (column lines) may form a sampling circuit and may have the same capacitance. Accordingly, a difference in the time constant between the capacitors 620 may depend on a difference in the composite resistance value between the output lines (column lines), that is, a difference in the current sum between the output lines (column lines).

The comparators 640 may be individually disposed at each output line (column line). Each of the comparators 640 determines whether a currently charged voltage in the capacitors 620 of the output line (column line) reaches the reference voltage $V_{ref}$. Each of the comparators 640 compares the voltage currently charged in each of the capacitors 620 with the reference voltage $V_{ref}$ and, when the voltage currently charged in each of the capacitors 620 has reached the reference voltage $V_{ref}$, outputs the stop signal STOP to the TDC 650 at a reached time point.

The comparators 640 receive the trigger pulse TRIGGER as a start signal of a comparison operation. In other words, the comparators 640 is activated (enabled) only when the trigger pulse TRIGGER is received from a control signal generator 630, and is deactivated (disabled) when the trigger pulse TRIGGER is not received. The receiving of the trigger pulse TRIGGER may mean that a pulse signal indicating a high level is received, but the disclosure is not necessarily limited to this example.

When receiving the start signal START indicating applying an input signal to the memory cell array 690, the control signal generator 630 may generate the trigger pulse TRIGGER and the counting pulse COUNT. The trigger pulse TRIGGER may be generated at a timing corresponding to a certain quantization level of quantization levels sectioned according to a charge time of the capacitors 620 in the sampling circuit. The quantization levels are described below in further detail with reference to FIGS. 7 and 8. The counting pulse COUNT is a signal to count a time when the trigger pulse TRIGGER is applied, as a pulse signal generated in synchronism with the trigger pulse TRIGGER when the application of the trigger pulse TRIGGER is initiated. The counting pulse COUNT is provided to the TDC 650.

The TDC 650 performs time-digital conversion at a time point when a voltage currently charged in a certain capacitor reaches the reference voltage $V_{ref}$.

In detail, the TDC 650 may receive the stop signal STOP from each of the comparators 640 connected to each output line (column line). As described above, the stop signal STOP is a signal indicating that the voltage currently charged in a certain capacitor has reached the reference voltage $V_{ref}$. The TDC 650 latches a counting value of the counting pulse COUNT at the time point when the stop signal STOP is received.

For example, when a voltage currently charged in the capacitor 621 of the i-th output line (the i-th column line) 692 has reached the reference voltage $V_{ref}$, a comparator 641 of the i-th output line (the i-th column line) 692 outputs a stop signal $STOP_i$ to the TDC 650. The TDC 650, when receiving the stop signal $STOP_i$, latches a counting value $T_{out,i}$ of the counting pulse COUNT at the time point when the stop signal STOP is received.

The output unit 660 may output, as a digital value OUT, a counting value with respect to a certain output line (column line) output from the TDC 650. In detail, the output unit 660 may output a quantization level corresponding to a counting value among preset quantization levels. The output quantization level is a value originated from the sampling voltage, and finally corresponds to the MAC operation result of the output line (column line).

The TDC 650 outputs a counting value for each output line, and the output unit 660 outputs a counting value for each output line in a quantization level. As described above, the quantization levels are described below in detail with reference to FIGS. 7 and 8.

Figure 7:
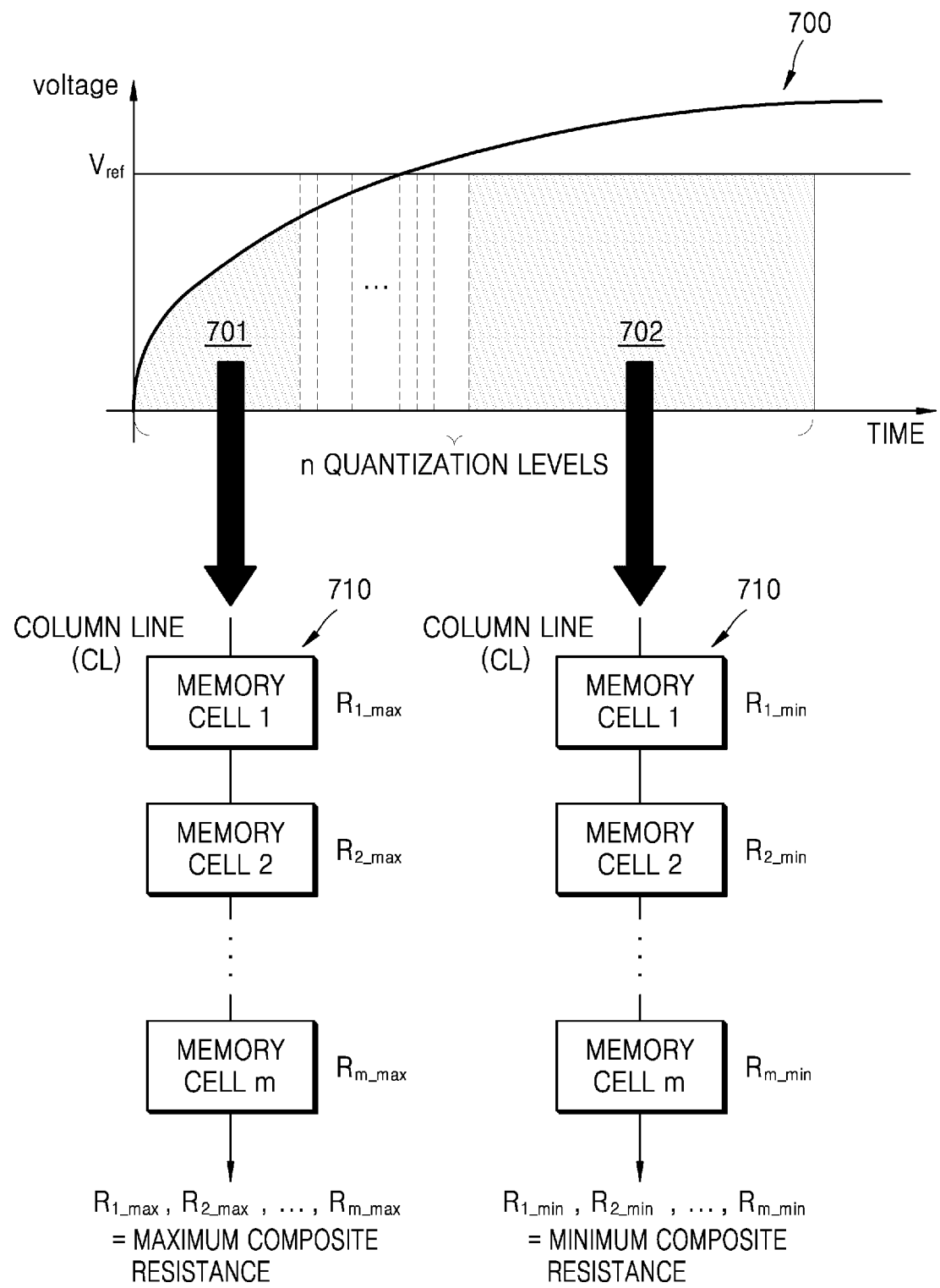
FIG. 7 illustrates setting time sections of quantization levels according to the time when a voltage is charged in a capacitor according to one or more embodiments.

FIG. 7 illustrates setting time sections of quantization levels according to the time when a voltage is charged in a capacitor according to one or more embodiments.

In FIG. 7, a graph 700 shows a charge voltage change of a capacitor constituting a sampling circuit provided in an in-memory processing device. In the graph 700, an x axis denotes a time elapsed after charging a capacitor with a sampling voltage starts, and a y axis denotes a change in the charge voltage in the capacitor over time.

The reference voltage $V_{ref}$ is a voltage input that may be used for comparison with a currently charged voltage of the capacitor by a comparator.

The in-memory processing device may be assumed to be a device capable of providing an operation result of a k-bit resolution, where k is a natural number. Furthermore, the k-bit resolution may be assumed to have n quantization levels, where n is a natural number.

As described above, the current sum in a certain column line may be applied to the capacitor as the corresponding sampling voltage. In an example where the capacitors provided in the sampling circuit are all described to have the same capacitance, it may be seen that a factor that causes a time constant ($\tau = R*C$) difference between the capacitors is only a resistance value, that is, a composite resistance value, of a column line to which each capacitor is connected. Based on the Ohm's law, the composite resistance value of the column line and the strength, that is, the current sum, of a column current flowing in the column line are inversely proportional to each other. Accordingly, it may be derived that the time constant difference between the capacitors depends on the current sum of each of the column lines. For example, when the current sum of a column line is relatively great (or, the sampling voltage is relatively less), as the time constant T of a capacitor decreases, the capacitor may be charged relatively fast to the reference voltage $V_{ref}$. In contrast, when the current sum of a column line is relatively less (or, the sampling voltage is relatively great), as the time constant $\tau$ of a capacitor increases, the capacitor may charged relatively slowly to the reference voltage $V_{ref}$.

The current sum of a certain column line corresponds to a MAC operation result in the column line, that is, a correlation exits therebetween. Accordingly, based on the above correlation, the time constant difference between the capacitors may be finally estimated to correspond to a difference of the MAC operation result.

For a k-bit resolution, a total time section in which a charge voltage varies until the capacitor is charged with the sampling voltage may be quantized into n sub-time sections. Each of the n sub-time sections corresponds to each of n quantization levels.

In further detail, an example in which m memory cells 710 are connected to a column line $CL_i$ is described below. It is assumed that each of the memory cells 710 may have a variable resistance, each of the m memory cells 710 may have any one of first resistance values $R_{1\_max}, R_{2\_max}, \ldots, R_{m\_max}$ or second resistance values $R_{1\_min}, R_{2\_min}, \ldots, R_{m\_min}$, and the first resistance value is greater than the second resistance value.

When, in the column line $CL_i$, the resistance values of the m memory cells 710 all have the first resistance values $R_{1\_max}, R_{2\_max}, \ldots, R_{m\_max}$, the composite resistance value of the m memory cells 710 is maximum. In contrast, when, in the column line $CL_i$, the resistance values of the m memory cells 710 all have the second resistance values $R_{1\_min}, R_{2\_min}, \ldots, R_{m\_min}$, the composite resistance value of the m memory cells 710 is minimum.

Accordingly, the composite resistance value with respect to the column line $CL_i$ may be distributed between the maximum composite resistance value calculated from an example in which the memory cells 710 all have the first resistance values $R_{1\_max}, R_{2\_max}, \ldots, R_{m\_max}$ and the minimum composite resistance value calculated from an example in which the memory cells 710 all have the second resistance values $R_{1\_min}, R_{2\_min}, \ldots, R_{m\_min}$.

An example in which the column line $CL_i$ has the maximum composite resistance value may correspond to an example in which a column current having the minimum current sum flows in the column line $CL_i$. In contrast, an example in which the column line $CL_i$ has the minimum composite resistance value may correspond to an example in which a column current having the maximum current sum flows in the column line $CL_i$. In light of the above principle, sub-time sections corresponding to the respective n quantization levels may be set.

A sub-time section 701 may correspond to an example in which a column current having the minimum current sum flows in the column line $CL_i$, and a sub-time section 702 may correspond to an example in which a column current having the maximum current sum flows in the column line $CL_i$. For example, the sub-time section 701 may correspond to a quantization level in which all bit values of the k-bit resolution are 0, and the sub-time section 702 may correspond to a quantization level in which all bit values of the k-bit resolution are 1.

A time section between the sub-time section 701 and the sub-time section 702 may include sub-time sections corresponding to the other quantization levels, and the sub-time sections may be divided to have the same intervals according to the number of the other quantization levels. However, the disclosure is not limited to this example, and the intervals of the sub-time sections corresponding to the number of the other quantization levels may not be the same. For example, according to a general simulation result with respect to the MAC operation result, the values of the most MAC operation results may be obtained through normalization by the Gaussian distribution. Accordingly, the intervals of the sub-time sections corresponding to the quantization levels may be set to be different from each other based on the Gaussian distribution.

In FIG. 7, in the graph 700, the quantization level may be set to increase by one level from the sub-time section 701 toward the sub-time section 702.

However, the disclosure is not limited to this example, and the quantization level may be set to decrease by one level from the sub-time section 701 toward the sub-time section 702. For example, in FIG. 7, although an example having the maximum composite resistance is described to correspond to the minimum quantization level and an example having the minimum synthetic resistance is described to correspond to the maximum quantization level, the opposite case may be set. In other words, the quantization level that each time section represents may vary according to the logic value indicated by each of the variable resistance values (first resistance value and second resistance value) of each of the memory cells 710.

Figure 8:
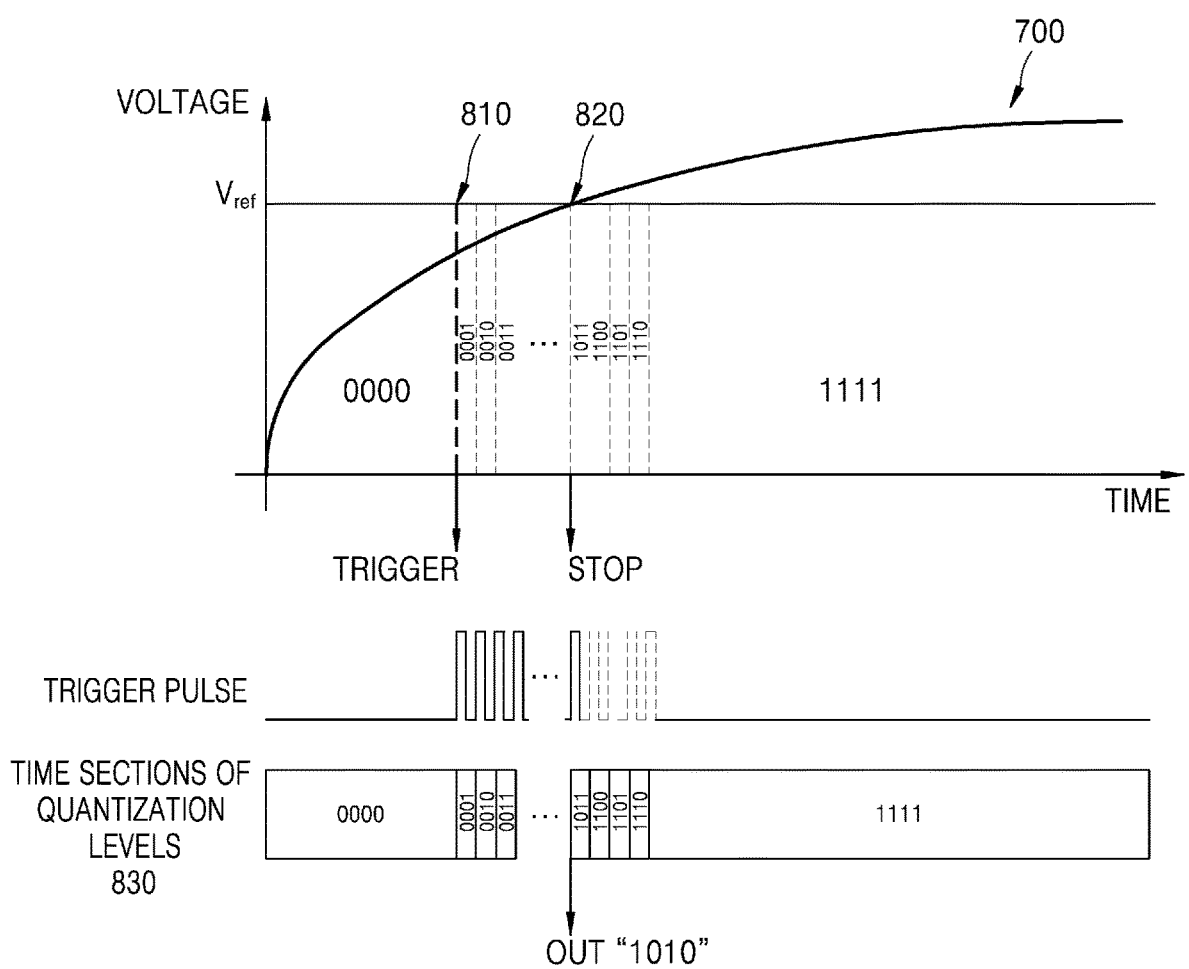
FIG. 8 illustrates a timing when a trigger pulse TRIGGER is applied to a comparator according to one or more embodiments.

FIG. 8 illustrates a timing when a trigger pulse TRIGGER is applied to a comparator, according to one or more embodiments.

In FIG. 8, the trigger pulse TRIGGER may be generated from a timing (time point) 810 corresponding to a certain quantization level. The certain quantization level may be a quantization level of the quantization levels, which is one level greater than the minimum quantization level. However, the disclosure is not limited to this example, and the trigger pulse TRIGGER may be generated from a time point when a certain time, for example, 40 ns, passes after the capacitor starts charging, without considering a time point corresponding to the quantization level.

As the trigger pulse TRIGGER is applied to the comparators from the timing (time point) 810 corresponding to a certain quantization level, power consumption according to the operation of the comparators at the minimum quantization level such as "0000" may be reduced. The trigger pulse TRIGGER may be generated to be applied to the comparators until a time section corresponding to a quantization level, for example, "1110", that is one level less than the maximum quantization level, for example, "1111", which may cause reduction of additional power consumption.

The pulse width of the trigger pulse TRIGGER may be set to be less than or equal to the interval of the sub-time sections corresponding to the respective quantization levels.

The comparator in the in-memory processing device may be implemented by a latched comparator type. Accordingly, the comparator may output a comparison result at a falling edge of the trigger pulse TRIGGER. For example, when a charge voltage of the capacitor reaches the reference voltage $V_{ref}$ at a time point 820, the comparator may output the stop signal STOP indicating the comparison result at the falling edge of the trigger pulse TRIGGER corresponding to the time point 820.

The time point when the stop signal STOP is output may be output to a quantization level "1010" through time-digital conversion.

A time constant of the capacitor varies according to the sampling voltage applied to the capacitor of a certain column line (or the current sum of a column line), and thus, the time points when the charge voltage of the capacitor reaches the reference voltage $V_{ref}$ vary. As illustrated in FIG. 8, sub-time sections 830 of 4-bit quantization levels may be set to correspond to the time points when the charge voltage of the capacitor reaches the reference voltage $V_{ref}$.

Figure 9:
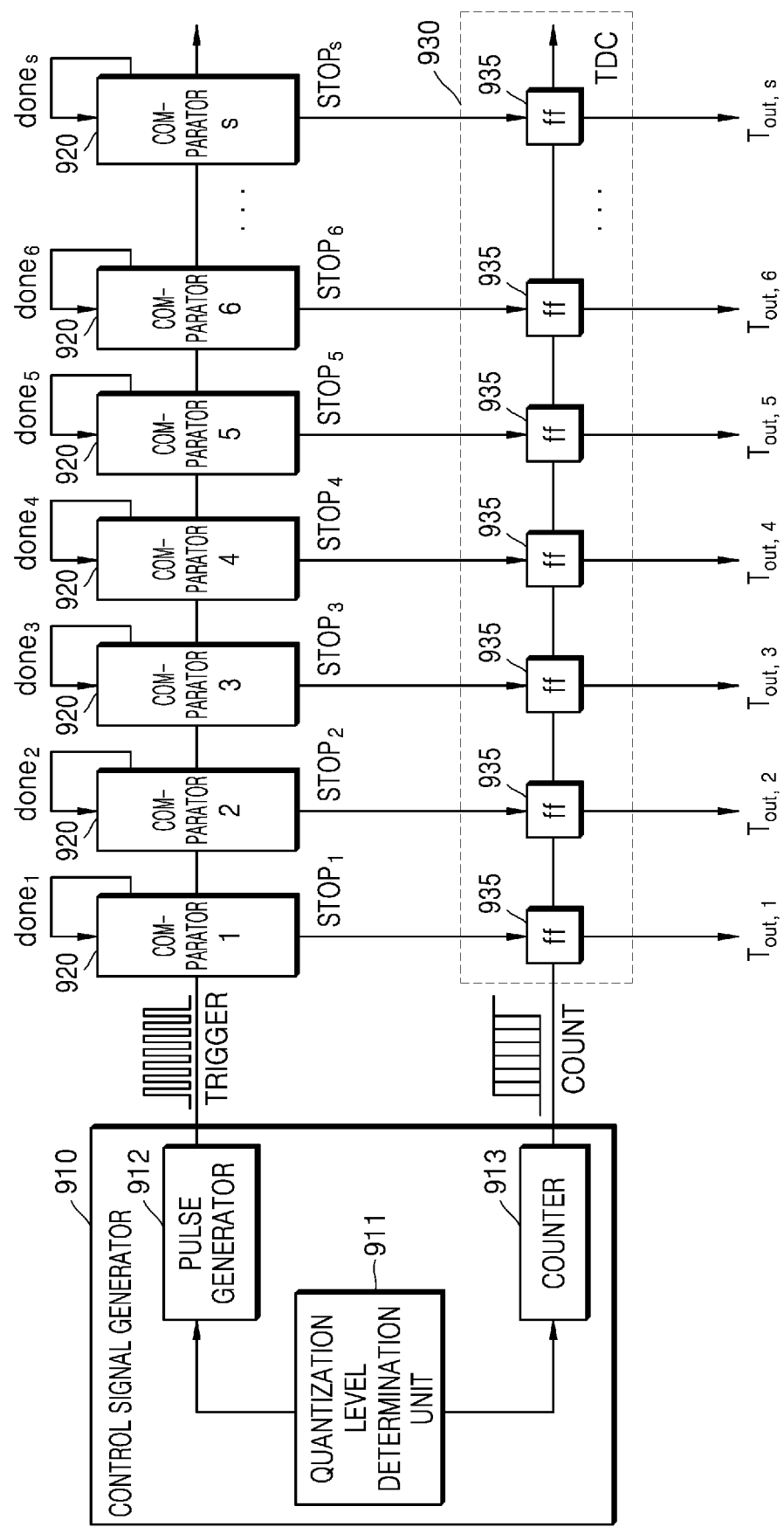
FIG. 9 illustrates time-digital conversion performed in an in-memory processing device according to one or more embodiments.

FIG. 9 illustrates time-digital conversion performed in an in-memory processing device, according to one or more embodiments.

In FIG. 9, a control signal generator 910 may include a quantization level determination unit 911, a pulse generator 912, and a counter 913. The pulse generator 912 generates a trigger pulse TRIGGER to initiate a comparison operation of the comparators 920. The counter 913 generates a counting pulse COUNT to identify a time point when a stop signal STOP provided by each of the comparators 920 is received. The applications of the trigger pulse TRIGGER and the counting pulse COUNT are synchronized with each other, and thus the counting pulse COUNT may be applied to a TDC 930 at a timing when the trigger pulse TRIGGER is applied to the comparators 920.

The timing when the trigger pulse TRIGGER is generated may be determined by the quantization level determination unit 911. The quantization level determination unit 911 may determine the timing when the trigger pulse TRIGGER is generated, considering the total number of quantization levels to be set, that is, the bit number of a digital value, the device properties of a capacitor for charging the sampling voltage, for example, capacitance or time constant, the resistance values of the memory cells connected to each column line, or the like.

For example, the quantization level determination unit 911 may determine the timing when the trigger pulse TRIGGER is generated, on the basis of the methods described above in FIGS. 7 and 8. In detail, the quantization level determination unit 911 may control the pulse generator 912 so that the trigger pulse TRIGGER is generated from the timing (time point) 810 of FIG. 8 corresponding to a certain quantization level, that is, a quantization level that is one level greater than the minimum quantization level. Furthermore, the quantization level determination unit 911 may control the pulse generator 912 so that the trigger pulse TRIGGER is generated until a time section corresponding to a certain quantization level, that is, a quantization level that is one level less than the maximum quantization level. The counter 913 may generate the counting pulse COUNT only while the trigger pulse TRIGGER is applied.

The comparators 920 receives the trigger pulse TRIGGER as a start signal of the comparison operation, and compares the voltage currently charged in the capacitor connected to each of the comparators 920 with the reference voltage. Each of the comparators 920 outputs the stop signal STOP to the TDC 930 at a time point when the voltage currently charged in the capacitor connected to each of the comparators 920 is determined to have reached the reference voltage.

Each of the comparators 920 may be implemented by a latched comparator type. Accordingly, the comparators 920 may output a comparison result at a falling edge of the trigger pulse TRIGGER. For example, when a comparator s detects that the charge voltage of the capacitor has reached the reference voltage at a certain time point, the comparator s may output the stop signal STOP as a flip-flop of the TDC 930 connected to the comparator s at the falling edge of the trigger pulse TRIGGER corresponding to the time point.

A comparator of the comparators 920, which outputs the stop signal STOP, may have a feedback of a signal (done) indicating that the output of the stop signal STOP is completed, and the comparator having the feedback of the signal (done) may be deactivated (disabled).

The TDC 930 may include flip-flops 935 respectively connected to the comparators 920. The flip-flops 935 may be activated (enabled) by the counting pulse COUNT received from the counter 913.

When the stop signal STOP is received from each of the comparators 920 during the application of the counting pulse COUNT, each of the flip-flops 935 latches the current counting value $T_{out}$ at the time point when the stop signal STOP is received. For example, when a connected to the comparator s receive the stop signal STOP from the comparator s during the application of the counting pulse COUNT, the flip-flops output a current counting value $T_{out\_s}$ of the counting pulse COUNT.

As such, as each of the flip-flops 935 provided in the TDC 930 individually outputs the counting value $T_{out}$ corresponding to a receiving time point of the stop signal STOP, the time-digital conversion with respect to each of the column lines (output lines) of the memory cell array 690 may be performed. As described above, the processing circuit 600 may map a digital value of a quantization level corresponding to the counting value $T_{out}$ for each column line (output line), and output a digital value, for example, a k-bit resolution, of the quantization level mapped for each column line (output line).

Figure 10:
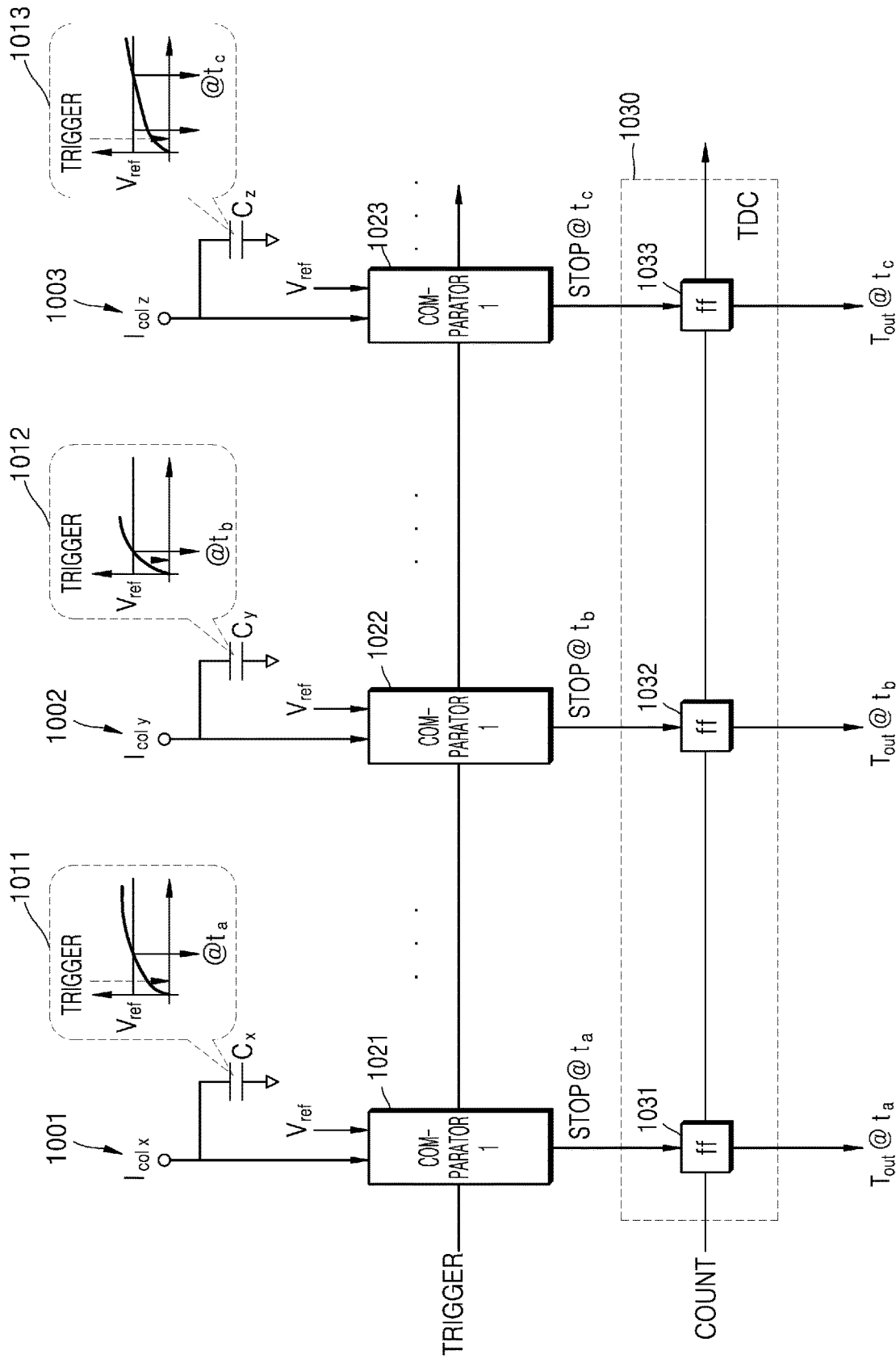
FIG. 10 illustrates outputting a counting value for each column line (output line) through time-digital conversion, according to one or more embodiments.

FIG. 10 illustrates outputting a counting value for each column line (output line) through time-digital conversion, according to one or more embodiments.

In FIG. 10, each of time points $t_a$, $t_b$, and $t_c$ denotes a time point when a voltage currently charged in each of capacitors $C_x$, $C_y$, and $C_z$ reaches the reference voltage $V_{ref}$. The time point $t_b$, the time point $t_a$, and the time point $t_c$ are listed in order of fast time.

Column currents having current sums $I_{col\_x}$, $I_{col\_y}$, and $I_{col\_z}$ flow in the column lines 1001, 1002, and 1003, respectively, and sampling voltages corresponding to the current sums $I_{col\_x}$, $I_{col\_y}$, and $I_{col\_z}$ are applied to the capacitors $C_x$, $C_y$, and $C_z$, respectively. The trigger pulse TRIGGER is applied to each of comparators 1021, 1022, and 1023 at the same time point, and the comparators 1021, 1022, and 1023 compare a voltage currently charged in each of the capacitors $C_x$, $C_y$, and $C_z$ with the reference voltage $V_{ref}$ from the time point when the trigger pulse TRIGGER is applied. In this state, the comparators 1021, 1022, and 1023 each may be a latched comparator, and thus each of the comparators 1021, 1022, and 1023 may perform the comparison operation at each falling edge of the trigger pulse TRIGGER.

First, at the time point $t_b$, the comparator 1022 determines that the voltage currently charged in the capacitor $C_y$ has reached the reference voltage $V_{ref}$, and outputs a stop signal STOP @$t_b$ to a flip-flop 1032 of a TDC 1030. The comparator 1022 having completed the output of the stop signal STOP @$t_b$ may be deactivated (disabled).

The counting pulse COUNT is applied to the TDC 1030 in synchronism with the trigger pulse TRIGGER. The flip-flop 1032 latches a counting value $T_{out}$ @$t_b$ of the counting pulse COUNT at the time point $t_b$ when the stop signal STOP @$t_b$ is received. Accordingly, among the column lines 1001, 1002, and 1003, time-digital conversion with respect to the column line 1002 is first completed. The counting value $T_{out}$ @$t_b$ may be output as a digital value of a mapped quantization level.

Next, at the time point $t_a$, the comparator 1021 outputs a stop signal STOP @$t_a$ to a flip-flop 1031. The comparator 1021 having completed the output of the stop signal STOP @$t_a$ may be deactivated (disabled). The flip-flop 1031 latches a counting value $T_{out}$ @$t_a$ of the counting pulse COUNT at the time point $t_a$ when the stop signal STOP @$t_a$ is received. As the counting value $T_{out}$ @$t_a$ corresponds to a value different from the counting value $T_{out}$ @$t_b$, a digital value of a quantization level mapped to the counting value $T_{out}$ @$t_a$ may be different from the digital value of a quantization level mapped to the counting value $T_{out}$ @$t_b$. However, even when the counting values $T_{out}$ @$t_a$ and $T_{out}$ @$t_b$ are output at different time points $t_a$ and $t_b$, when the different time points $t_a$ and $t_b$ belong to the same sub-time section corresponding to the same quantization level, time-digital conversion may be performed as a digital value of the same quantization level.

The comparator 1023 outputs a stop signal STOP @$t_c$ to a flip-flop 1033 at the time point $t_c$. The comparator 1021 having completed the stop signal STOP @$t_c$ may be deactivated (disabled). The flip-flop 1033 latches a counting value $T_{out}$ @$t_c$ of the counting pulse COUNT at the time point $t_c$ when the stop signal STOP @$t_c$ is received.

The processing circuit in the in-memory processing device may perform the MAC operation for each column line (output line) through the above-described time-digital conversion. In the in-memory processing device in the examples, unlike the Von Neumann structure in which a memory and an operation portion are separated from each other, data transmission speed and power consumption may be improved. Furthermore, as the in-memory processing device does not need to include ADCs in separate column lines, compared with an architecture having ADCs, power consumption and an occupation area in a circuit may be reduced.

In the above-described embodiments, although it is assumed that the voltage value of an input signal and the resistance value of a memory cell have a binary value such as a value (or logic 1) corresponding to on ON and a value (or logic 0) such as off OFF, the embodiments are not limited to this example. The voltage value of an input signal and the resistance value of a memory cell may have values distinguished by a multi-state. For example, when a 2-bit value is input to one input line (row line), an input signal (input voltage) is floated with respect to "00", and a first voltage value, a second voltage value that is greater than the first voltage value, and a third voltage value that is greater than the second voltage value may be assigned, as input signals, with respect to "01", "10", and "11", respectively. Furthermore, when a memory cell indicates a 2-bit value, a first resistance value, a second resistance value that is greater than the first resistance value, a third resistance value, and a fourth resistance value may be assigned to the memory cell with respect to "00", "01", "10", and "11", respectively. The input signal received in each input line (row line) and each memory cell are not limited to indicating a 2-bit multi-state, and may indicate a multi-state corresponding to a greater bit, and a value according to other numeral system than the binary system may be assigned.

Figure 11:
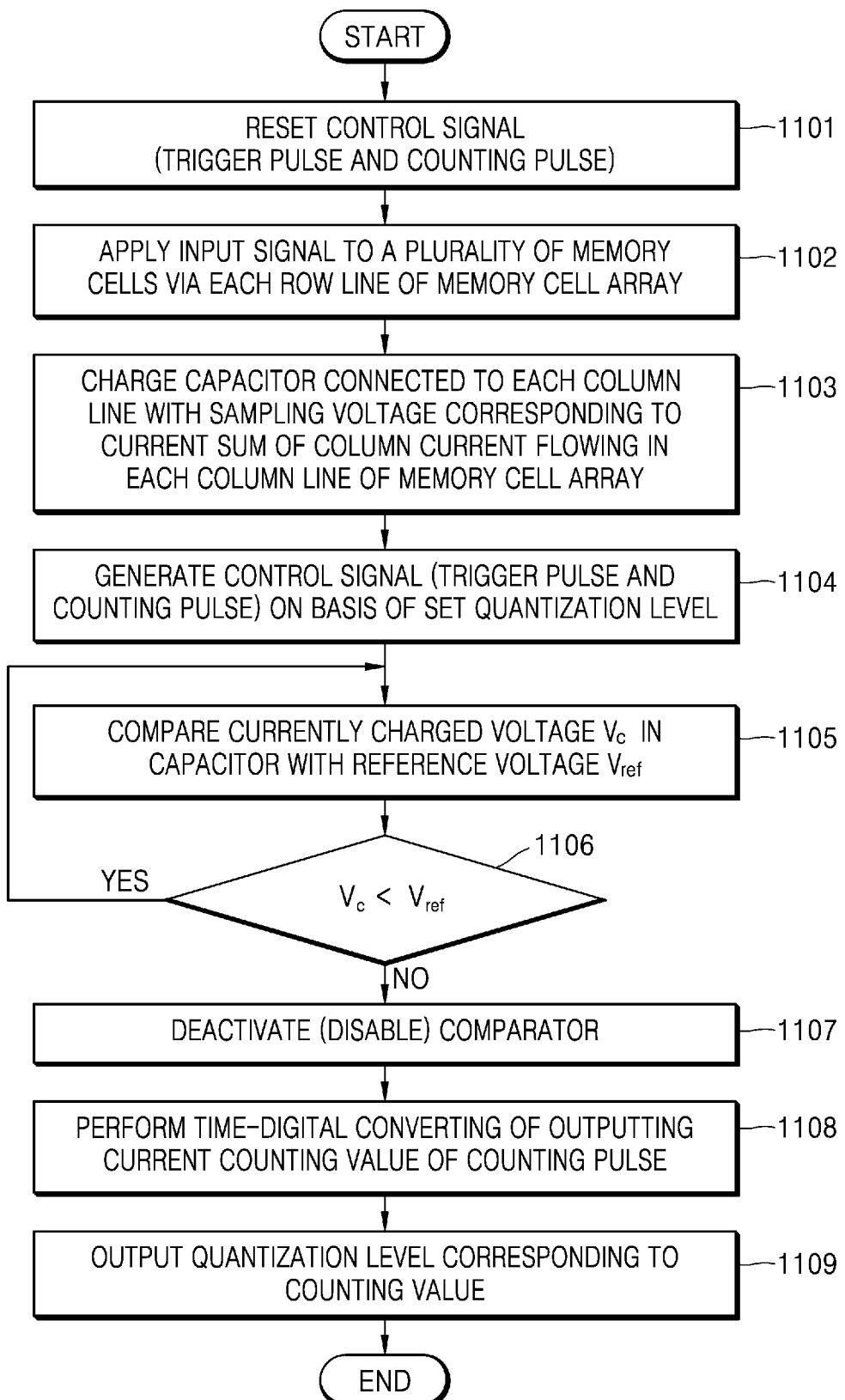
FIG. 11 is a flowchart of a method of performing in-memory processing according to one or more embodiments.

FIG. 11 is a flowchart of a method of performing in-memory processing according to one or more embodiments. In FIG. 11, as the method of performing in-memory processing is related to the embodiments described with reference to the above-described drawings, any description provided above, but omitted below, may be applied to the method of FIG. 11.

In operation 1101, the control signal generator 630 of the processing circuit 600 resets a control signal, that is, the trigger pulse TRIGGER and the counting pulse COUNT.

In operation 1102, an input signal is applied to the memory cells 610 via each row line of the memory cell array 690.

In operation 1103, each of the capacitors 620 of the processing circuit 600 is charged with a sampling voltage corresponding to a current sum of a column current flowing in each column line of the memory cell array 690.

In operation 1104, the control signal generator 630 of the processing circuit 600 generates a control signal, that is, the trigger pulse TRIGGER and the counting pulse COUNT, on the basis of a set quantization level. The trigger pulse TRIGGER is applied to the comparators 640, and the counting pulse COUNT is applied to the TDC 650.

In operation 1105, the comparators 640 of the processing circuit 600, during the application of the trigger pulse TRIGGER, compare the currently charged voltage Vc in the capacitors 620 respectively connected to this example with the reference voltage $V_{ref}$.

In operation 1106, each of the comparators 640 determines whether the currently charged voltage Vc in the capacitors 620 has reaches the reference voltage $V_{ref}$. The comparator, which determines that the currently charged voltage Vc has reached the reference voltage $V_{ref}$, outputs the stop signal STOP to the TDC 650, and operation 1107 is performed. Otherwise, operation 1106 is performed again.

In operation 1107, the comparator that outputs the stop signal STOP is deactivated (disabled).

In operation 1108, the TDC 650 of the processing circuit 600 performs time-digital conversion of outputting a current counting value of the counting pulse COUNT.

In operation 1109, the output unit 660 of the processing circuit 600 outputs a digital value of a quantization level corresponding to the counting value.

Figure 12:
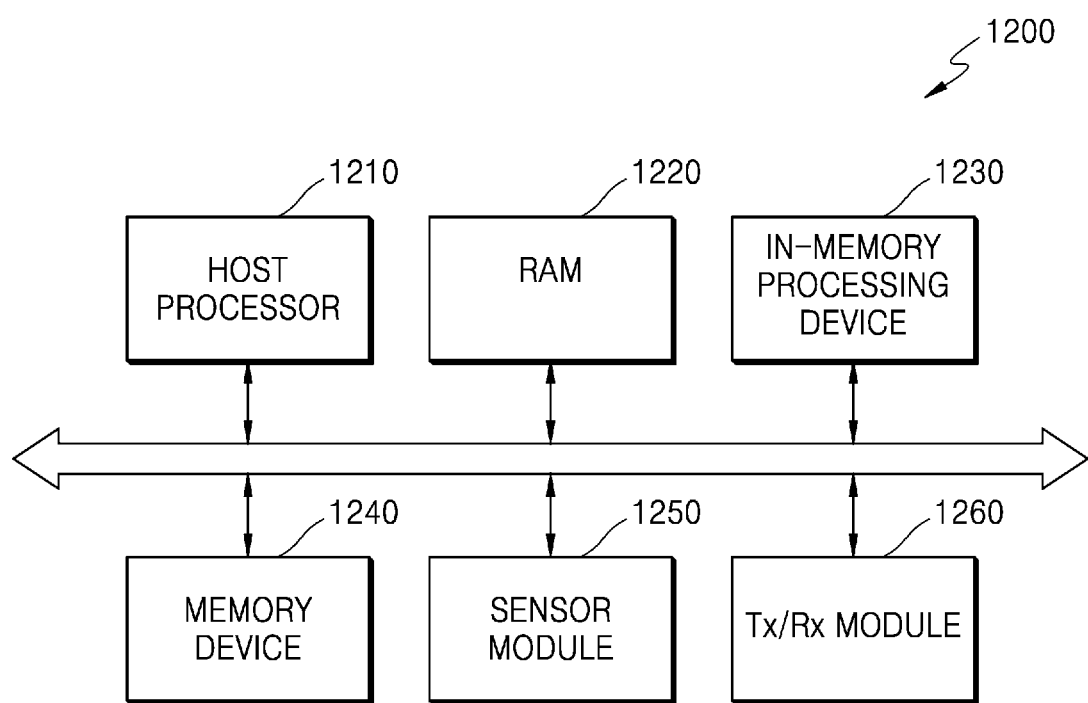
FIG. 12 is a block diagram of a computing apparatus according to one or more embodiments.

FIG. 12 is a block diagram of a computing apparatus 1200 according to one or more embodiments.

In FIG. 12, the computing apparatus 1200 may extract valid information by analyzing input data in real time on the basis of a neural network, and determine a situation on the basis of the extracted information or control elements of an electronic device where the computing apparatus 1200 is mounted. For example, the computing apparatus 1200 may be applied to robotic devices such as drones or advanced drivers assistance system (ADAS), smart TVs, smart phones, medical devices, mobile devices, image display devices, measurement devices, IoT devices, or the like, and may be mounted on at least one of other various types of electronic devices.

The computing apparatus 1200 may include a host processor 1210, RAM 1220, an in-memory processing device 1230, a memory device 1240, a sensor module 1250, and a communication module 1260. The computing apparatus 1200 may further include an input/output module, a security module, a power control device, or the like. Some of hardware elements of the computing apparatus 1200 may be mounted on at least one semiconductor chip. The in-memory processing device 1230, which is a device including the in-memory processing device described in the above drawings, may correspond to a neural network dedicated hardware accelerator or a neural network device including the same.

The host processor 1210 may be configured to control the overall operation of the computing apparatus 1200. The host processor 1210 may include one processor core (single core) or a plurality of processor cores (multi-core). The host processor 1210 may process or execute programs and/or data stored in the memory device 1240. The host processor 1210 may control the function of the in-memory processing device 1230 by executing the programs stored in the memory device 1240. The host processor 1210 may be implemented by a central processing unit (CPU), a graphics processing unit (GPU), an application processor (AP), or the like.

The RAM 1220 may temporarily store programs, data, or instructions. For example, the programs and/or data stored in the memory device 1240 may be temporarily stored in the RAM 1220 according to a control or booting code of the host processor 1210. The RAM 1220 may be implemented by a memory such as dynamic RAM (DRAM) or static RAM (SRAM).

The in-memory processing device 1230 may perform the neuromorphic operation, for example, the MAC operation, which are described in the above drawings, and output a MAC operation result. However, the in-memory processing device 1230 may perform other various in-memory computing.

The memory device 1240, as a storage for storing data, may store an operating system (OS), various programs, and various data. In an embodiment, the memory device 1240 may store pieces of data, for example, input signal data, weight data, or the like, which are necessary for performing the operation of the in-memory processing device 1230, and operation result data, for example, a MAC operation result, that is, quantization level data, or the like.

The memory device 1240 may be DRAM, but the disclosure is not limited to this example. The memory device 1240 may include at least one of a volatile memory or a non-volatile memory. The non-volatile memory may include ROM, PROM, EPROM, EEPROM, flash memory, PRAM, MRAM, RRAM, FRAM, or the like. The volatile memory may include DRAM, SRAM, SDRAM, PRAM, MRAM, RRAM, FeRAM, or the like. In an embodiment, the memory device 1240 may include at least one of HDD, SSD, CF, SD, Micro-SD, Mini-SD, xD, or Memory Stick.

The sensor module 1250 may collect information around an electronic device where the computing apparatus 1200 is mounted. The sensor module 1250 may sense or receive a signal, for example, an image signal, a voice signal, a magnetic signal, a bio signal, a touch signal, or the like, from the outside of the electronic device, and convert the sensed or received signal into data. To this end, the sensor module 1250 may include at least one of various types of sensing devices, for example, a microphone, an imaging device, an image sensor, a light detection and ranging (LIDAR) sensor, an ultrasonic sensor, an infrared sensor, a bio sensor, a touch sensor, or the like.

The sensor module 1250 may provide the converted data to the in-memory processing device 1230, as input data. For example, the sensor module 1250 may include an image sensor, and may generate a video stream by photographing an external environment of the electronic device, and sequentially provide sequential data frames of the video stream to the in-memory processing device 1230, as input data. However, the disclosure is not limited to this example, and the sensor module 1250 may provide various types of data to the in-memory processing device 1230.

The communication module 1260 may be provided with various wired or wireless interface capable of communicating with the external device. For example, the communication module 1260 may include a wired local area network (LAN), a wireless local area network (WLAN) such as wireless fidelity (Wi-Fi), a wireless personal area network (WPAN) such as Bluetooth, a wireless universal serial bus (USB), Zigbee, near field communication (NFC), radio-frequency identification (RFID), power line communication (PLC), or a communication interface capable of accessing a mobile cellular network such as 3rd generation (3G), 4th generation (4G), long term evolution (LTE), or 5th generation (5G), or the like.

Figure 13:
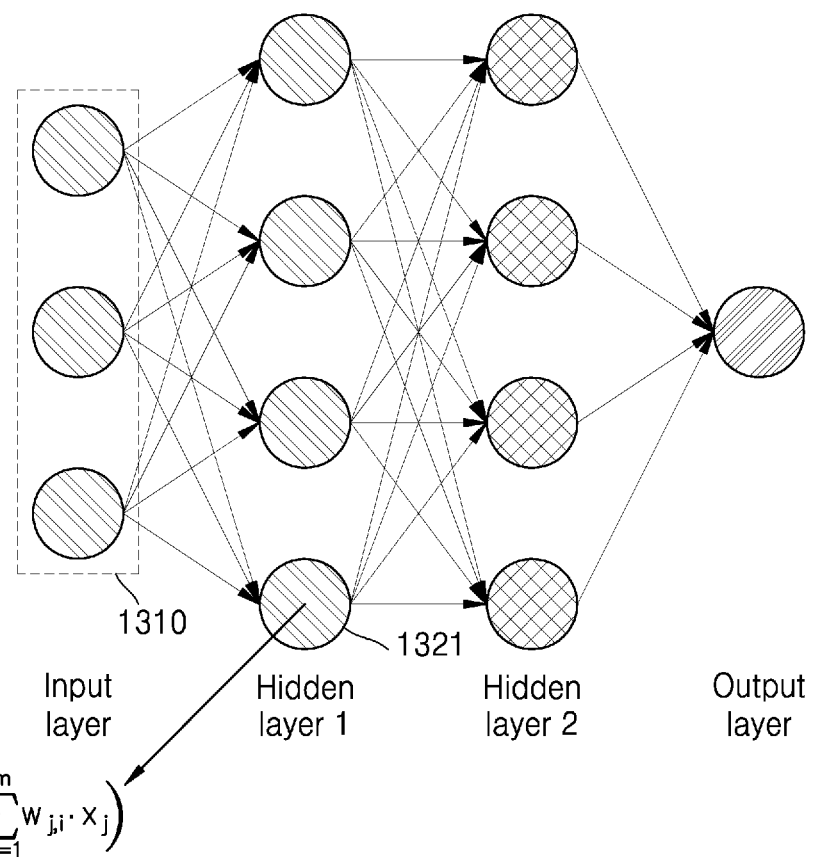
FIG. 13 illustrates an example of a neural network.

FIG. 13 illustrates an example of a neural network 1300.

In FIG. 13, the neural network 1300 may correspond to an example of a deep neural network (DNN). For convenience of explanation, although the neural network 1300 is illustrated to include two hidden layers, the neural network 1300 may include various numbers of hidden layers. Furthermore, although FIG. 13 illustrates that the neural network 1300 includes a separate input layer 1310 for receiving input data, the input data may be directly input to a hidden layer.

In the neural network 1300, artificial nodes of layers excluding an output layer may be connected to artificial nodes of a next layer via links for transmitting an output signal. An output of an activation function regarding weighted inputs of the artificial nodes included in a previous layer may be input to the artificial nodes via the links. The weighted input is obtained by multiplying an input (node value) of an artificial node by a weight, and the input corresponds to the axon values and the weight corresponds to the synaptic weights. The weight may be referred to as a parameter of the neural network 1300. The activation function may include sigmoid, hyperbolic tangent (tan h), and a rectified linear unit ReLU, and non-linearity may be formed in the neural network 1300 by the activation function.

Ahead of the in-memory processing or in-memory computing for deep learning algorithm driving, the in-memory processing device described in the above drawings may be used. For example, the calculation of a weighted input transmitted between nodes 1321 of the neural network 1300 may be configured with the MAC operation. An output of one of the nodes 1321 included in the neural network 1300 may be expressed by Equation 1 below.

$$y_i = f\left(\sum_{j=1}^{m} w_{j,i} x_j\right)$$ [Equation 1]

Equation 1 may show an output value $y_i$ of the i-th node 1321 with respect tom input values in a layer. $x_j$ may denote an output value of the j-th node in a previous layer, and $w_{j,i}$ may denote a weight applied to the output value of the j-th node and the i-th the node 1321 of the current layer. f( ) may denote an activation function. As shown in Equation 1, a multiplication accumulated result of the input value $x_j$ and the weight $w_{j,i}$ may be used with respect to the activation function. In other words, an operation (MAC operation) of multiplying and adding the appropriate input value $x_j$ and weight $w_{j,i}$ at a desired time point may be repeated. In addition to the above purpose, there are various application fields needing the MAC operation, and to this end, a neuromorphic device capable of processing the MAC operation in an analog area may be used.

A plurality of memory cells of the in-memory processing device may have resistance corresponding to a connection weight of a connection line connecting a plurality of nodes in the neural network 1300 provided with one or more layers including a plurality of nodes. The input signal provided according to the input lines (row lines) where the memory cells are arranged may indicate a value corresponding to the node value $x_j$. Accordingly, the in-memory processing device may perform at least part of the operations needed for the implement of the neural network 1300.

The application of the in-memory processing device may not necessarily be limited to the neuromorphic operation, and may be used for an operation of quickly processing at low power a plurality of pieces of input data using the analog circuit characteristics.

Figure 14:
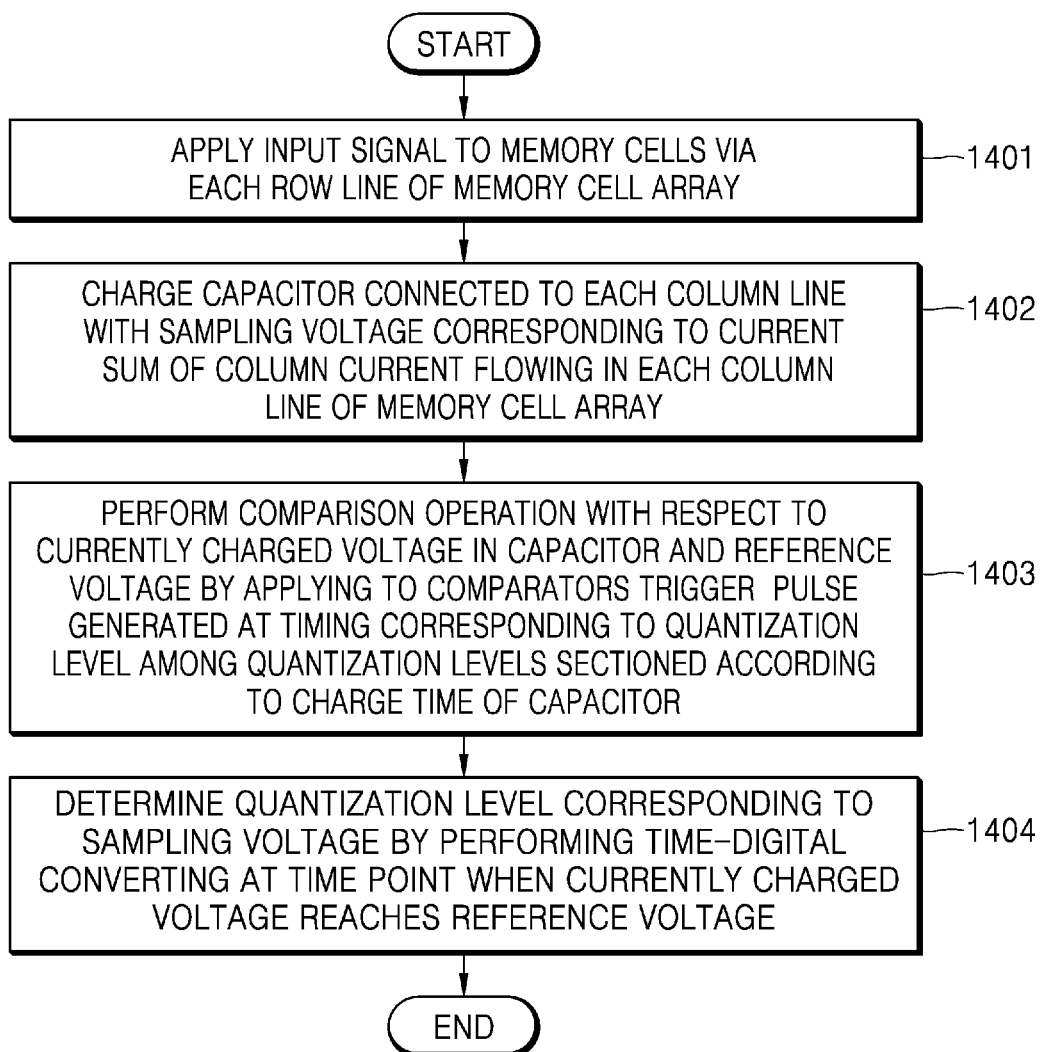
FIG. 14 is a flowchart of a method of performing in-memory processing according to one or more embodiments.

FIG. 14 is a flowchart of a method of performing in-memory processing according to one or more embodiments. In FIG. 14, as the method of performing in-memory processing is related to the embodiments described in the above-described drawings, any description described above, but omitted below, may be applied to the method of FIG. 14.

In operation 1401, an input signal is applied to the memory cells 610 via each row line of the memory cell array 690.

In operation 1402, the processing circuit 600 charges a capacitor 620 connected to each column line with a sampling voltage corresponding to a current sum of a column current flowing in each column line of the memory cell array 690.

In operation 1403, the processing circuit 600 performs a comparison operation between a currently charged voltage in the capacitor 620 and a reference voltage by applying to comparators a trigger pulse generated at a timing corresponding to a quantization level among quantization levels sectioned according to a charge time of the capacitor 620.

In operation 1404, the processing circuit 600 determines a quantization level corresponding to the sampling voltage by performing time-digital conversion at a time point when the currently charged voltage reaches the reference voltage.

The in-memory processing device 60, 100, 1230, memory cells 110, capacitor C, 620, TDC 140, 650, processing circuit 600, comparators 640, quantization level determination unit 911, pulse generator 912, counter 913, computing apparatus 1200, host processor 1210, ram 1220, memory 1240, sensor module 1250, and Tx/Rx module 1260 in FIGS. 1-14 that perform the operations described in this application are implemented by hardware components configured to perform the operations described in this application that are performed by the hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The method illustrated in FIGS. 1-14 that performs the operations described in this application is performed by computing hardware, for example, by one or more processors or computers, implemented as described above executing instructions or software to perform the operations described in this application that are performed by the method. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An apparatus, comprising:
a memory processing device configured to:
apply an input signal to row lines of memory cells of a memory cell array;
charge a capacitor connected to each column line of the memory cells using a sampling voltage corresponding to a current sum of a column current flowing in respective column lines;
compare a reference voltage and a currently charged voltage in the capacitor in response to a trigger pulse generated at a timing corresponding to a quantization level, among quantization levels, time-sectioned based on a charge time of the capacitor; and
determine the quantization level corresponding to the sampling voltage by performing time-digital conversion when the currently charged voltage reaches the reference voltage.

2. The apparatus of claim 1, wherein the memory processing device comprises:
a control signal generator configured to generate the trigger pulse at the timing corresponding to the quantization level and a counting pulse in synchronism with the generation of the trigger pulse; and
a comparator connected to each column line and activated by the trigger pulse.

3. The apparatus of claim 2, wherein the comparator is further configured to receive the trigger pulse as a start signal of the comparison operation, and output a stop signal when the currently charged voltage reaches the reference voltage.

4. The apparatus of claim 3, wherein the memory processing device further comprises a time-digital converter (TDC) configured to output a counting value of a counting pulse as a digital value when the stop signal is received, the counting pulse being applied in synchronism with the trigger pulse at a time point when the stop signal is received.

5. The apparatus of claim 4, wherein the memory processing device is further configured to determine the quantization level by outputting the counting value of the counting pulse as the digital value.

6. The apparatus of claim 4, wherein the TDC comprises flip-flops, connected to the comparators, configured to latch a current counting value at a time point when the stop signal is received.

7. The apparatus of claim 4, wherein one of the comparators which outputs the stop signal is deactivated.

8. The apparatus of claim 1, wherein each of the quantization levels corresponds to a sub-time section of a total time section in which a charge voltage changes until the capacitor is charged with the sampling voltage.

9. The apparatus of claim 8, wherein the sub-time section is determined based on either one or both a resistance value of the memory cells and a capacitance of the capacitor.

10. The apparatus of claim 1, wherein the quantization level corresponding to the timing of the trigger pulse generation is one level greater than a minimum quantization level of the quantization levels.

11. The apparatus of claim 1, wherein the trigger pulse is applied until a time section corresponding to a quantization level that is one level less than a maximum quantization level of the quantization levels.

12. The apparatus of claim 1, wherein
a minimum quantization level of the quantization levels corresponds to the memory cells included in each one of the column lines having a maximum composite resistance, and
a maximum quantization level of the quantization levels corresponds to the of memory cells included in each one of the column lines having a minimum composite resistance.

* * * * *